United States Patent [19]
Yoshida

[11] Patent Number: 5,863,354
[45] Date of Patent: *Jan. 26, 1999

[54] FLEXIBLE PHOTOELECTRIC CONVERSION MODULE

[75] Inventor: Takashi Yoshida, Tokyo, Japan

[73] Assignee: Fuji Electric Co., Ltd., Kawasaki, Japan

[ * ] Notice: The term of this patent shall not extend beyond the expiration date of Pat. No. 5,584,940.

[21] Appl. No.: 629,806

[22] Filed: Apr. 10, 1996

Related U.S. Application Data

[63] Continuation-in-part of Ser. No. 574,788, Dec. 19, 1995, Pat. No. 5,584,940, which is a continuation of Ser. No. 314,408, Sep. 28, 1994, abandoned.

[30] Foreign Application Priority Data

Sep. 28, 1993 [JP] Japan .................................. 5-240768

[51] Int. Cl.$^6$ .......................... H01L 31/048; H01L 31/05
[52] U.S. Cl. .......................... 136/251; 136/244; 156/543; 437/2; 437/51; 437/205; 437/207; 437/211; 437/212; 437/219
[58] Field of Search .................................. 136/244, 251; 437/2-5, 51, 205-207, 211-212, 219; 156/543

[56] References Cited

U.S. PATENT DOCUMENTS

| | | | |
|---|---|---|---|
| 4,443,652 | 4/1984 | Izu et al. | 136/251 |
| 5,584,940 | 12/1996 | Yoshida | 136/251 |

*Primary Examiner*—Aaron Weisstuch
*Attorney, Agent, or Firm*—Brumbaugh, Graves, Donohue & Raymond

[57] ABSTRACT

Thin-film photoelectric conversion elements are spaced from each other on an insulating belt-like film. Respective common conductive tapes are soldered to the terminal electrodes of the elements at the two edges of the film. The common conductive tape is in contact with non-adhesive resin in gap portions between adjacent photoelectric conversion elements. For forming a module, the assembly can be cut at these portions, followed by removal of the non-adhesive resin to expose the common conductive tape for external connection of the module.

16 Claims, 6 Drawing Sheets

FLEXIBLE PHOTOELECTRIC CONVERSION MODULE

This application is a continuation-in-part of application Ser. No. 08/574,788, filed on Dec. 19, 1995, now U.S. Pat. No. 5,584,940 issued Dec. 17, 1996, which was a continuation of application Ser. No. 08/314,408, filed on Sep. 28, 1994, now abandoned.

BACKGROUND OF THE INVENTION

The present invention relates to modules of semiconductor devices for converting light into electrical energy.

Flexible, lightweight, photoelectric conversion elements have a flexible substrate, e.g., a polymer film, and further include an amorphous silicon layer and electrode layers laminated on the substrate. Such an element can be brought into intimate contact with any desired curved shape. The amorphous silicon layer has a PIN-junction on the substrate. One of the electrode layers is transparent. Such photoelectric conversion elements can be combined into modules.

Figure 2A:
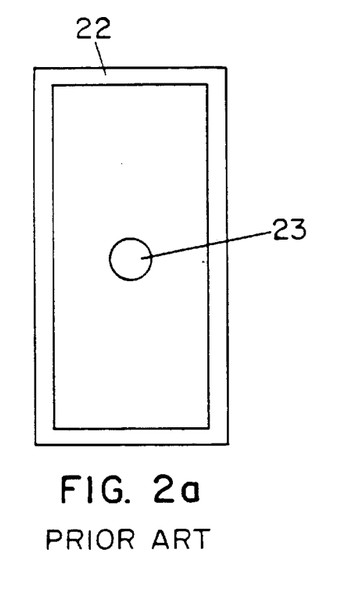
FIGS. 2a and 2b are plan and bottom views, respectively, of a conventional photoelectric conversion module.
Figure 2B:
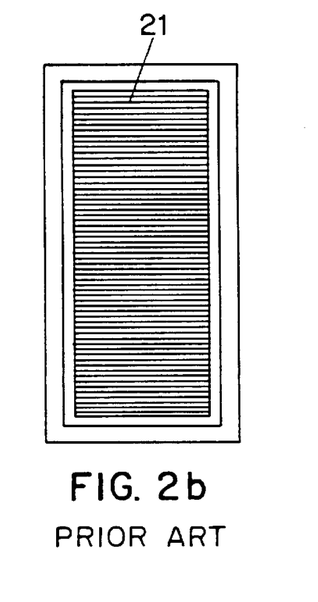

FIGS. 2a and 2b show the front and rear surfaces, respectively, of a conventional photoelectric conversion module. A plurality (three in the figures) of submodules 21 are connected in series. The submodules are laminated with a surface-protecting film. A frame 22 is attached to the periphery for reinforcement. Electrical connection is via a terminal box 23 mounted on one surface.

In conventional photoelectric conversion modules, photoelectric conversion elements are laminated in a module having predetermined shape. This limits the size of the module. Where large-area coverage is desired as, e.g., on the roof of a building, many modules must be interconnected by lead wires in series and in parallel, or a connecting terminal box must be provided for each module. In the latter case, it is necessary to take out electrically connected portions from the module with conductive tape. The need for such connections lowers the manufacturing efficiency, impedes mass production, slows down installation, and impairs the reliability of power generation unless costly sealing is provided for wiring connections.

SUMMARY OF THE INVENTION

A preferred flexible photoelectric conversion module comprises a row of thin-film photoelectric conversion elements spaced from each other longitudinally and fixed on an insulating belt-like flexible substrate. Common conductive tape is connected to the terminal electrodes at the respective ends of the photoelectric conversion elements, the "ends" being transverse to a direction along the length of the substrate. Non-adhesive resin contacts with at least one surface of the conductive tape in the gaps between the photoelectric conversion elements. Those portions of the photoelectric conversion elements and the common conductive tape which are not coated with the non-adhesive resin are adhesively bonded to the substrate at one surface, and to insulating protective film at the other surface. The common conductive tape is connected to the terminal electrodes directly or through conductive bonding tapes. Advantageously, plural rows of thin-film photoelectric conversion elements can be placed side by side, with common conductive tape connecting adjacent terminal electrodes of the rows of thin-film photoelectric conversion elements.

In addition, an adhesive bond to the insulating substrate and to the insulating protective film can be made by a thermosetting adhesive resin. A fluorocarbon resin can be used as the non-adhesive resin. Preferably, the common conductive tape is a metal foil having one surface coated with solder for soldering the tape to the terminal electrodes of the thin-film photoelectric conversion elements.

In a preferred method for connecting such a flexible photoelectric conversion module, the module is cut in one of the gaps between the thin-film photoelectric conversion elements, along a line passing through the non-adhesive resin. The non-adhesive resin is removed from the cut portion, thereby exposing the common conductive tape. A connecting conductor is bonded to the exposed surface of the common conductive tape. It is desirable then to cover the exposed surface of the common conductive tape with a weatherproof material.

A preferred apparatus for fabricating the above-described flexible photoelectric conversion module comprises:

a mechanism for advancing the flexible insulating substrate, the thermosetting adhesive resinous film, the common conductive tape, and the insulating protective film;

a mechanism for placing the thin-film photoelectric conversion elements and the non-adhesive resin alternately on the thermosetting adhesive resinous film while the thermosetting adhesive resinous film laminated on the substrate is in motion;

a pressure-applying and heating mechanism for brazing the common conductive tape to the terminal electrodes of the photoelectric conversion elements;

a mechanism for laminating the insulating protective film on a side of the thin-film photoelectric conversion elements and the common conductive tape opposite to the substrate via the thermosetting adhesive resinous film; and a pressure-applying and heating mechanism for bonding with the thermosetting adhesive resin.

DETAILED DESCRIPTION OF PREFERRED EMBODIMENTS

A preferred photoelectric conversion module comprises plural thin-film photoelectric conversion elements spaced from each other longitudinally on an insulating belt-like flexible substrate. A common conductive tape is connected to the terminal electrodes at the ends of the photoelectric conversion elements, the "ends" being transverse to a direction along the length of the substrate as indicated by a double arrow A in FIG. 1. Non-adhesive resin is adhesively bonded to the common conductive tape in the gaps between the elements. The other portions are adhesively bonded to the substrate at one surface, the other surface being adhesively bonded to insulating protective film. The module is cut along a cutting line passing through the portion at which the common conductive tape is in contact with the non-adhesive insulating resin. After cutting, the adhesive insulating resin is removed, thus exposing the common conductive tape. This portion can be electrically connected. Then, for reliability of connection, the exposed portion of the common conductive tape on the substrate can be coated with a weatherproof material. The module can also be interconnected via this exposed portion.

A module can be fabricated in the form of a long belt and can be wound up. A module can also be cut at any desired portion. Thus, in wide-area coverage, labor can be eliminated which heretofore was required in placing and electrically connecting modules.

Figure 1:
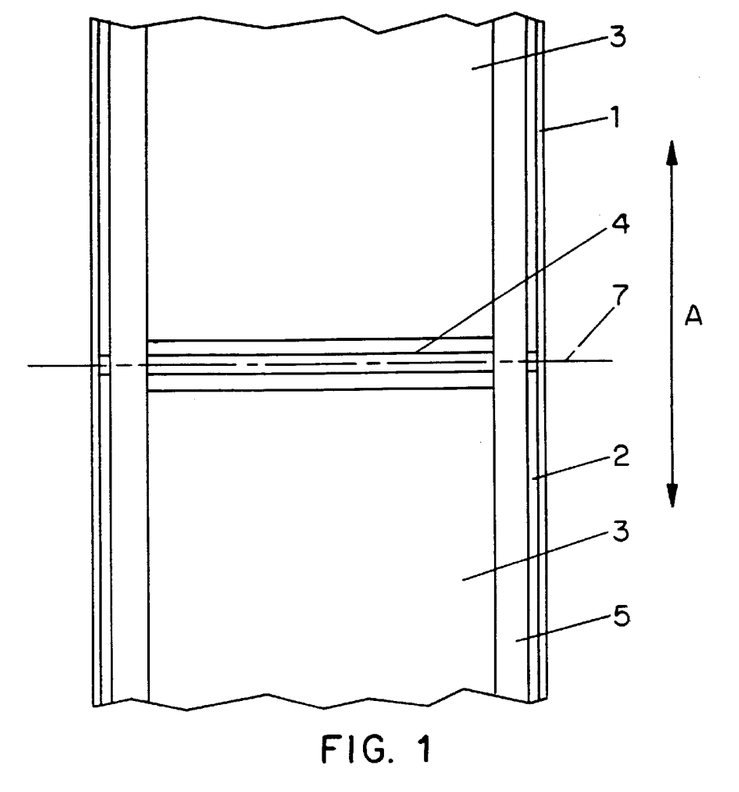
FIG. 1 is a schematic plan view of a representative portion of a flexible photoelectric conversion module in accordance with a preferred embodiment of the present invention.

FIG. 1 shows photoelectric conversion elements 3 fastened on a belt-shaped transparent film 1 by a thermosetting adhesive resin 2 such as ethylene vinylacetate. Preferably, the film 1 is made of a fluorocarbon resin or other weatherproof material. The photoelectric conversion elements 3 are spaced from each other. The center of a gap between conversion elements 3 is coated with a non-adhesive resin 4, such as a fluorocarbon resin, e.g., polytetrafluoroethylene. A common conductive tape 5, such as copper foil, is soldered onto the terminal electrode portions at both ends of each photoelectric conversion element. Solder has been previously coated on one or both surfaces of the tape 5. Then, another layer of non-adhesive resin is placed over the non-adhesive resin 4 such that the common conductive tape 5 is sandwiched between two sheets of resin. The non-adhesive resin 4 is formed across the whole module width between the photoelectric conversion elements. Alternatively, it may be formed only at the parts occupied by the common conductive tape. Thermosetting adhesive resin and a weatherproof film may be placed on top. Heat may be applied continuously on one surface of the module to set the adhesive. Heat may also be applied after assembly to complete the module.

Figure 3A:
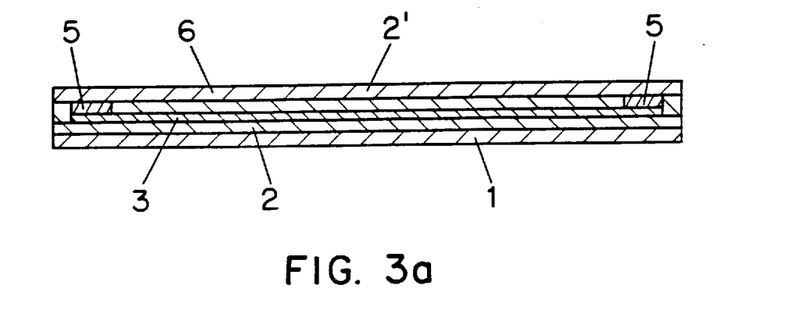
FIGS. 3a–3c are cross-sectional views showing cross-sectional structure of the module shown in FIG. 1 at three locations.
Figure 3B:
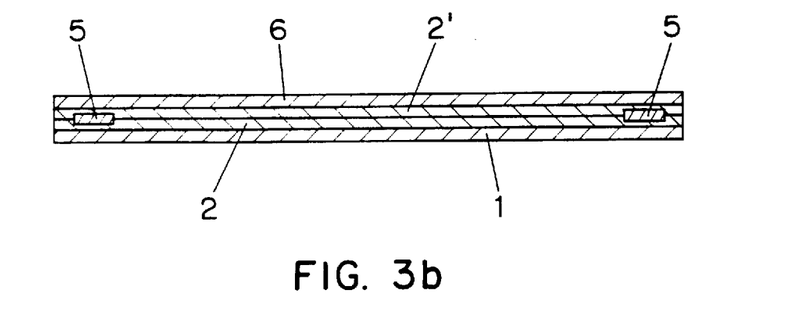
Figure 3C:
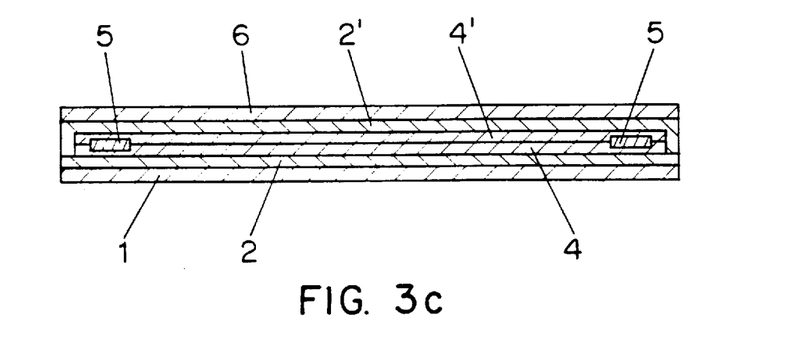

FIG. 3a shows a cross section of the photoelectric conversion element portion. FIG. 3b shows a cross section of a portion in which neither the photoelectric conversion element 3 nor the non-adhesive resin 4 is present. FIG. 3c shows a cross section of the portion of the non-adhesive resin 4.

Shown in FIGS. 3a–3c are weatherproof transparent resinous film 1 such as a fluorocarbon resin, thermosetting adhesive resin 2, 2', photoelectric conversion element 3, non-adhesive resin 4, 4', common conductive tape 5, and weatherproof film 6. Bonding between the thermosetting adhesive resin 2' and the weatherproof film 6 is by thermocompression.

In FIG. 3b, the thermosetting adhesive resin 2' and the weatherproof film 6 are shown as pressed against the common conductive tape 5.

In FIG. 3c, the non-adhesive resin 4, 4' is shown coating the common conductive tape 5. The thermosetting adhesive resin 2' and resinous film 6 are pressed against the resin 4'.

The photoelectric conversion module can be cut into a desired length at the position of line 7 in FIG. 1. In the cut portion, the non-adhesive resin 4 is removed to expose the contact surface of the common conductive tape 5. Connections can then be made. For electrical connection, lead wires can be connected directly to this connecting portion. Alternatively, the connecting portion may be provided with connecting terminals, and the connections may be made at this portion. Also, the module may be connected directly. After connection the connecting portion is laminated or sealed by an adhesive or the like. Where no electrical connections are made after the non-adhesive resin 4 is removed from the cut portion, the common conductive tape 5 is cut into shorter portions and then a lamination is again applied, or the connecting portion is sealed by an adhesive or the like. In the structure shown in FIG. 3, the non-adhesive resin 4 coats both surfaces of the common conductive tape 5. It is also possible to coat only one surface, in which case the other surface is exposed.

Figure 4:
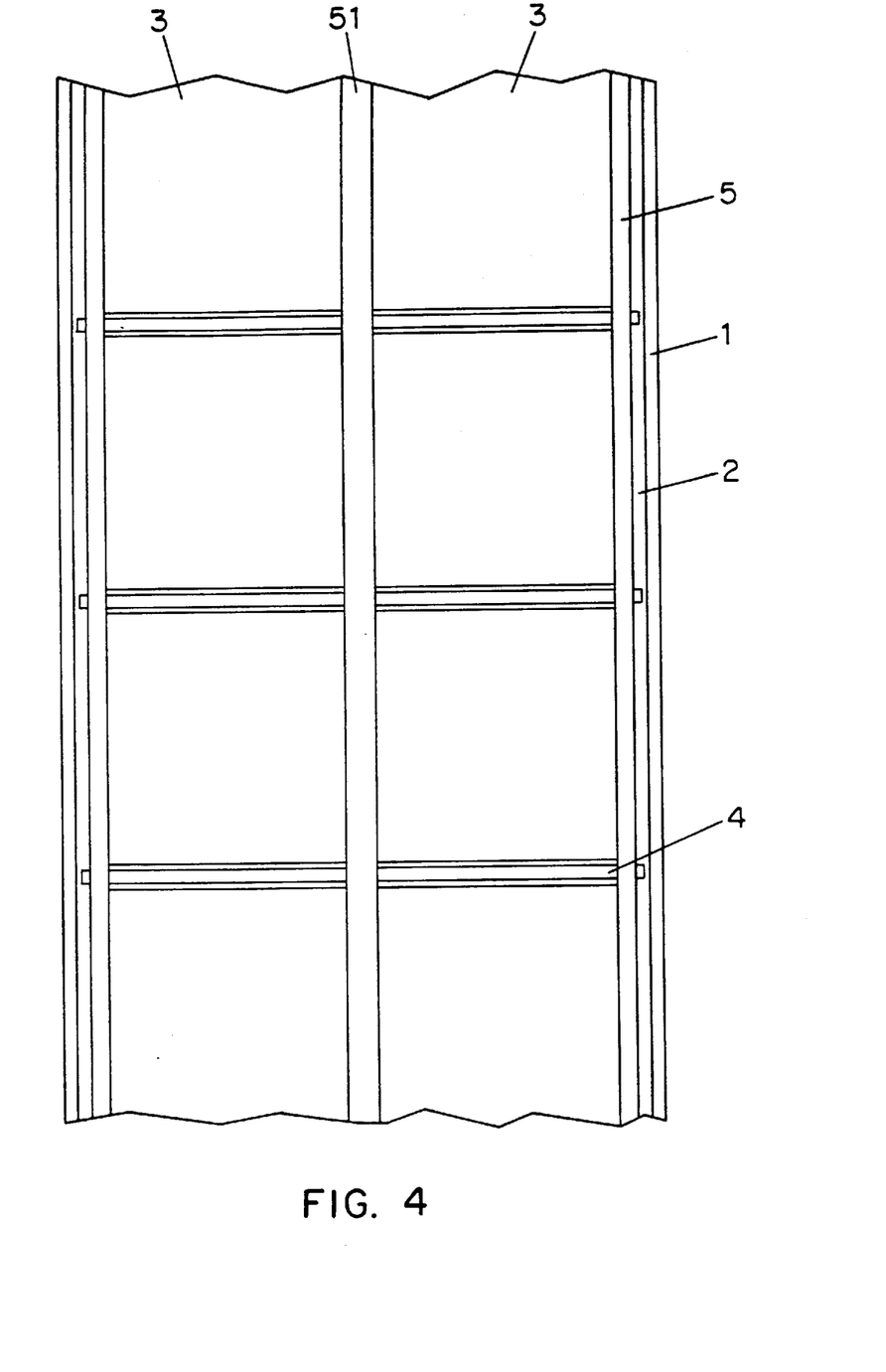
FIG. 4 is a schematic plan view of a representative portion of a flexible photoelectric conversion module in accordance with a preferred alternative embodiment of the present invention.

In the embodiment of FIG. 4, two rows of photoelectric conversion elements 3 are arranged side by side. Common conductive tape 51 is provided at an intermediate position to interconnect the two rows of the module. If the terminal electrodes that are soldered to the common conductive tape 51 have the same polarity, then the two rows of photoelectric conversion elements 3 are connected in parallel. If the electrodes are opposite in polarity, the two rows of photoelectric conversion elements 3 are connected in series. It is also possible to form photoelectric conversion elements in more than two rows. The width of the module can be enlarged as desired.

Figure 5A:
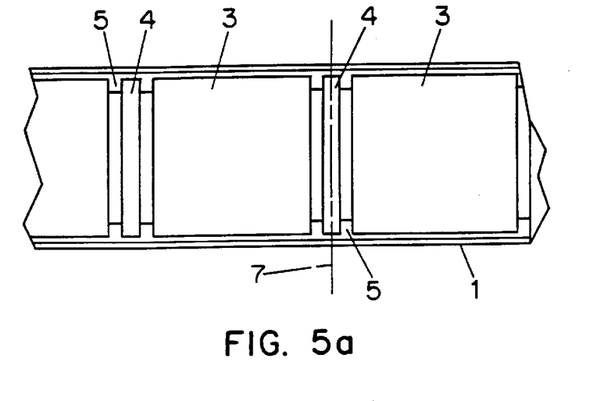
FIGS. 5a–5d are plan views illustrating the sequence in which the module of FIG. 1 is connected.
Figure 5B:
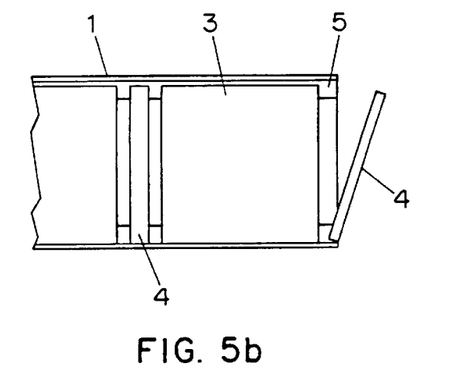
Figure 5C:
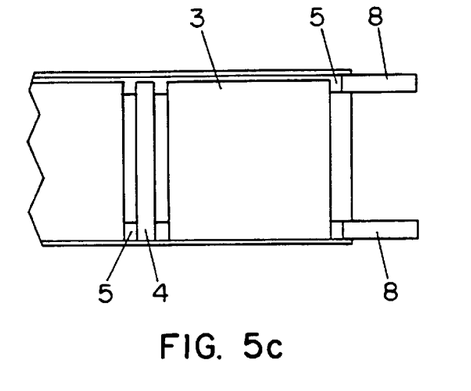
Figure 5D:
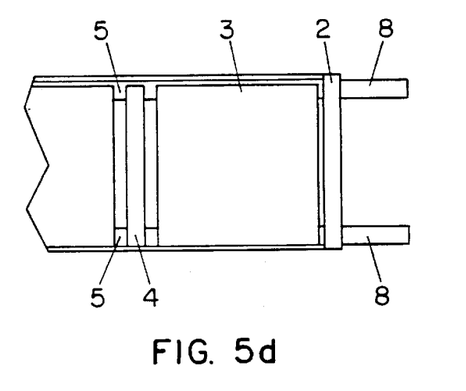

FIGS. 5a–5d illustrate a preferred sequence for connecting a module of the invention. First, the module is cut at a desired position along a cutting line 7 on the non-adhesive resin 4 (FIG. 5a). The non-adhesive resin 4 is removed from the cut portion to expose the common conductive tape 5 (FIG. 5b). The solder surface of copper tape 8 is placed on one solder-coated surface of the common conductive tape 5, and heat is applied to melt together the solder on the two tapes (FIG. 5c). The connecting portion of the common conductive tape is coated with the thermosetting adhesive resin 2, heat is applied, and the connection portion is sealed (FIG. 5d). By this method, the module can be connected easily and with high reliability to an external to an external circuit or to another module. If desired, the module can be connected to a connecting terminal. In this method, thermosetting adhesive resin originally on the module is used to seal the connecting portion. Alternatively or in combination, a sealing adhesive may be used. Also, a frame for an end portion may be mounted.

Figure 6:
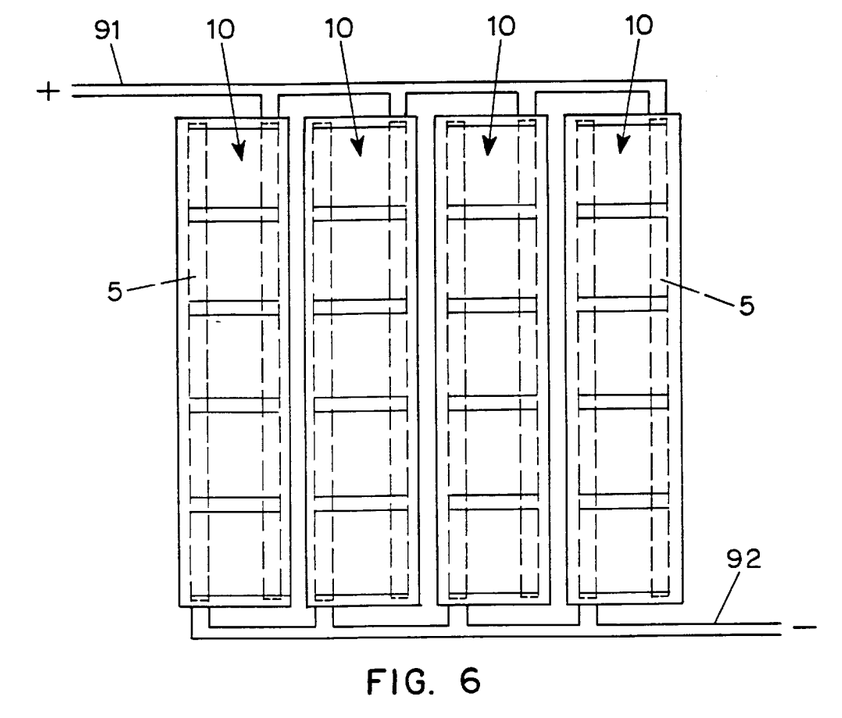
FIG. 6 is a plan view exemplifying electrical connection to the module of FIG. 1.

FIG. 6 illustrates an arrangement of photoelectric conversion modules. Modules 10 cut to dimensions to fit the installation site are laid so as to fully cover the site. A lead wire 91 is connected to the common conductive tape on the positive terminal side of each module by the method illustrated in FIG. 5 to form a positive terminal for the assembly. Similarly, a lead wire 92 is connected to the common conductive tape on the negative terminal side to form a negative terminal for the assembly.

Figure 7:
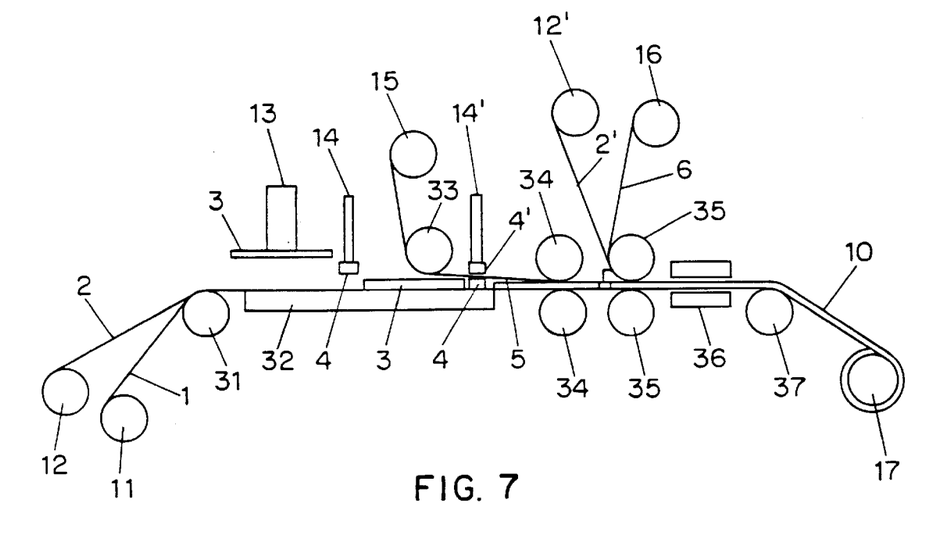
FIG. 7 is a side elevation of a module fabrication apparatus in accordance with a preferred embodiment of the invention.

FIG. 7 shows a preferred apparatus for fabricating a photoelectric conversion module of the invention. One side of the apparatus is equipped with a roll 11 for supplying transparent weatherproof film 1, and also with a roll 12 for supplying thermosetting adhesive resin in the form of a film 2. The films 1 and 2 are placed on top of each other by passing them past a feeder roller 31 and paid out. Supply devices 13 and 14 for placing the photoelectric conversion elements 3 and the non-adhesive resin 4 in an alternating, non-overlapping pattern on the films are mounted opposite to the support base 32. The common conductive tape 5 is supplied from a supply roll 15 via a feed roller 33 onto the electrode terminals of the photoelectric conversion elements. Non-adhesive resin 4' is again supplied from a supply device 14' onto the previously positioned non-adhesive resin 4. Opposite thermocompression rollers 34 solder together the common conductive tape 5 and the terminal electrode portion of the photoelectric conversion element 3. Also, a bond is made with the resin 2. Then, thermosetting adhesive resin 2' is again paid out from a thermosetting adhesive resin supply roll 12'. Weatherproof film 6 is paid out from a weatherproof film supply roll 16. The films are placed on the photoelectric conversion element 3, the non-adhesive resin, and the common conductive tape 5. They are bonded together thermally by opposite thermocompression rollers 35 and adhesively with the resin, and they are passed through a heater 36 to cure the resin. A resulting module 10 can be wound on a take-up roller 17 via a feed roller 37. Thus, a module structure shown in FIGS. 1, 3a–3c or 4 can be manufactured continuously using this apparatus.

Preferably, the photoelectric conversion element supply device 13 and non-adhesive resin supply devices 14 and 14' are equipped with mechanisms for attracting supplied objects by vacuum attraction and advancing them toward a desired position under compressed-air pressure.

Figure 8:
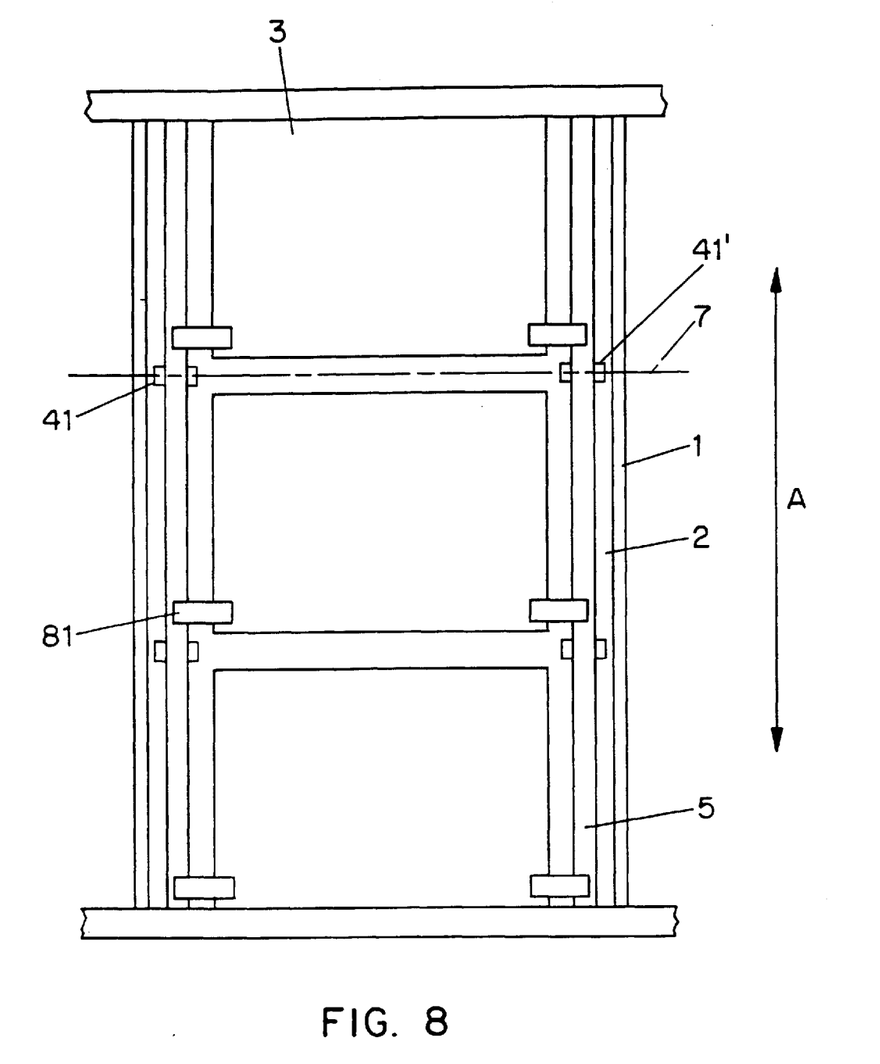
FIG. 8 is a schematic plan view of a representative portion of a flexible photoelectric conversion module in accordance with another preferred embodiment of the present invention.

FIG. 8 is a schematic plan view of a representative portion of a flexible photoelectric conversion module in accordance with another preferred embodiment of the present invention. In FIG. 1, the common conductive tape 5 is extended over the entire ends of the photoelectric conversion elements. In the embodiment of FIG. 8, common conductive tapes 5, extending along the ends of the photoelectric conversion elements 3, the "ends" being transverse to a direction along the length of the substrate as indicated by a double arrow A in FIG. 8, are connected with terminal electrodes of the photoelectric conversion elements 3 via conductive bonding tapes 81. Both ends of the conductive bonding tape 81 are soldered, respectively, onto the common conductive tape 5 and an electrode portion at one end of each photoelectric conversion element 3. Solder may be coated previously on both ends of the conductive bonding tape 81.

When the terminal electrode portion of each photoelectric conversion elements 3 is formed on only a part of the end of the photoelectric conversion element 3, it is sufficient for the common conductive tape 5 to contact only the terminal electrode of the photoelectric conversion element 3. If the conductive bonding tape 81 is not used in this case, it is necessary to insulate the common conductive tape 5 and a portion other than the terminal electrode portion of each photoelectric conversion element 3 from each other. However, if they are insulated by an insulation film, moisture may penetrate between the photoelectric conversion elements 3 and the common conductive tape 5 into the module to deteriorate the module. This hazard is obviated by providing the conductive bonding tapes 81, which separates the common conductive tape 5 and the photoelectric conversion elements 3.

In FIG. 8, the common conductive tape 5 and the photoelectric conversion elements 3 are insulated from each other except in their terminal electrode portions and are spaced widely enough to prevent electrical corrosion.

The conductive bonding tape 81 may be bridged between the common conductive bonding tape 5 and the photoelectric conversion element 3 by a labelling mechanism or by an automatic tape soldering mechanism, added to the module fabrication apparatus of FIG. 7.

In FIG. 8, two short non-adhesive resin layers 41, 41' are separated and arranged on a portion of line 7. The non-adhesive resin 4 of FIG. 1 may also be replaced by the short non-adhesive resin layers 41 and 41'. Since the non-adhesive resin such as fluorocarbon resin is expensive, the short non-adhesive resin layer is effective for reducing the cost of the module. Portions to be sealed after cutting are shortened by virtue of the short non-adhesive resin layers. The non-adhesive resin layer 41 is placed on the gap between the photoelectric conversion elements 3 by a labelling mechanism added to the module fabrication apparatus of FIG. 7.

I claim:

1. A flexible photoelectric conversion module comprising:
   a. a flexible belt-like insulating substrate having a major direction of elongation and a transverse direction;
   b. a plurality of thin-film photoelectric conversion elements spaced along the major direction on one side of the substrate, firmly secured to the substrate and spaced such that there are gaps between adjacent photoelectric conversion elements, each of the photoelectric conversion elements having first and second terminal electrodes at respective transverse ends of said elements;
   c. a first common conductive tape extending in the major direction and electrically connected to the first terminal electrodes;
   d. a non-adhesive resin in contact with at least one surface of the first common conductive tape in the gap between adjacent photoelectric conversion elements; and
   e. an insulating protective film firmly secured to those portions of the photoelectric conversion elements and the first common conductive tape which are not in contact with the non-adhesive resin, the film being secured on the surfaces facing away the substrate.

2. The flexible photoelectric conversion module of claim 1, further comprising a second common conductive tape extending in the major direction and electrically connected to the second terminal electrodes.

3. The flexible photoelectric conversion module of claim 2, wherein the second common conductive tape is directly connected to the second terminal electrodes.

4. The flexible photoelectric conversion module of claim 2, wherein conductive bonding tapes connect the second common conductive tape to the second terminal electrodes.

5. The flexible photoelectric conversion module of claim 1, wherein the first common conductive tape is directly connected to the first terminal electrodes.

6. The flexible photoelectric conversion module of claim 1, wherein conductive bonding tapes connect the first common conductive tape to the first terminal electrodes.

7. The flexible photoelectric conversion module of claim 1, wherein the thin-film photoelectric conversion elements are arranged in plural rows on the substrate.

8. The flexible photoelectric conversion module of claim 7, wherein the first common conductive tape is connected commonly to adjacent terminal electrodes of each row of the thin-film photoelectric conversion elements.

9. The flexible photoelectric conversion module of claim 1, wherein the insulating substrate and the insulating protective film are secured with a thermosetting adhesive resin bond.

10. The flexible photoelectric conversion module of claim 1, wherein the non-adhesive resin is a fluorocarbon resin.

11. The flexible photoelectric conversion module of claim 1, wherein the conductive tape is a metal foil having one surface coated with solder, and is soldered to the terminal electrodes of the thin-film photoelectric conversion elements.

12. A method for connecting a flexible photoelectric conversion module comprising:
   a. a flexible belt-like insulating substrate having a major direction of elongation and a transverse direction;
   b. a plurality of thin-film photoelectric conversion elements spaced along the major direction on one side of the substrate, firmly secured to the substrate and spaced such that there are gaps between adjacent photoelectric conversion elements, each of the photoelectric conversion elements having first and second terminal electrodes at respective transverse ends of said elements;
   c. a common conductive tape extending in the major direction and electrically connected to the first terminal electrodes;
   d. a non-adhesive resin in contact with at least one surface of the common conductive tape in the gap between adjacent photoelectric conversion elements; and
   e. an insulating protective film firmly secured to those portions of the photoelectric conversion elements and the common conductive tape which are not in contact with the non-adhesive resin, the film being secured on the surfaces facing away the substrate,
   the method comprising the steps of:
      i. cutting the module along a line passing through the non-adhesive resin in a gap between the thin-film photoelectric conversion elements;
      ii. removing the non-adhesive resin from the cut portion; and
      iii. bonding a connecting conductor to the exposed front surface of the common conductive tape.

13. The method of claim 12, further comprising the step of:
   coating the exposed surface of the common conductive tapes with a weatherproof material.

14. An apparatus for fabricating a flexible photoelectric conversion module, said module comprising:
   a. a flexible belt-like insulating substrate having a major direction of elongation and a transverse direction;
   b. a plurality of thin-film photoelectric conversion elements spaced along the major direction on one side of the substrate, firmly secured to the substrate and spaced such that there are gaps between adjacent photoelectric conversion elements, each of the photoelectric conversion elements having first and second terminal electrodes at respective transverse ends of said elements;
   c. a common conductive tape extending in the major direction and electrically connected to the first terminal electrodes;
   d. a non-adhesive resin in contact with at least one surface of the common conductive tape in the gap between adjacent photoelectric conversion elements; and
   e. an insulating protective film firmly secured to those portions of the photoelectric conversion elements and the common conductive tape which are not in contact with the non-adhesive resin, the film being secured on the surfaces facing away the substrate,
   the apparatus comprising:
      i. means for advancing the flexible insulating substrate, first and second thermosetting adhesive resinous films, the common conductive tape, and the insulating protective film;
      ii. means for placing the first thermosetting adhesive resinous film on the flexible insulating substrate while both are in motion, and means for placing the thin-film photoelectric conversion elements and the non-adhesive resin in an alternating pattern on the first thermosetting adhesive resinous film placed on the substrate while both the first thermosetting adhesive resinous film and the substrate are in motion;
      iii. first pressure-applying and heating means for brazing the common conductive tape to the terminal electrodes of the photoelectric conversion elements;
      iv. means for laminating the insulating protective film and the second thermosetting adhesive resinous film onto a side of the thin-film photoelectric conversion elements and the common conductive tape opposite to the substrate; and
      v. second pressure-applying and heating means for bonding with the first and second thermosetting adhesive resinous films.

15. The apparatus of claim 14 for fabricating the flexible photoelectric conversion module, said module further comprising first conductive bonding tapes connecting the common conductive tape to the first terminal electrodes,
   the apparatus further comprising means for bridging the first conductive bonding tapes between the respective first terminal electrodes and the common conductive tape.

16. The apparatus of claim 15 for fabricating the flexible photoelectric conversion module, said module further comprising:
   a second common conductive tape; and
   second conductive bonding tapes connecting the common conductive tape to the second terminal electrodes,
   the apparatus further comprising means for bridging the second conductive bonding tapes between the respective second terminal electrodes and the second common conductive tape.

* * * * *